Figure 1:
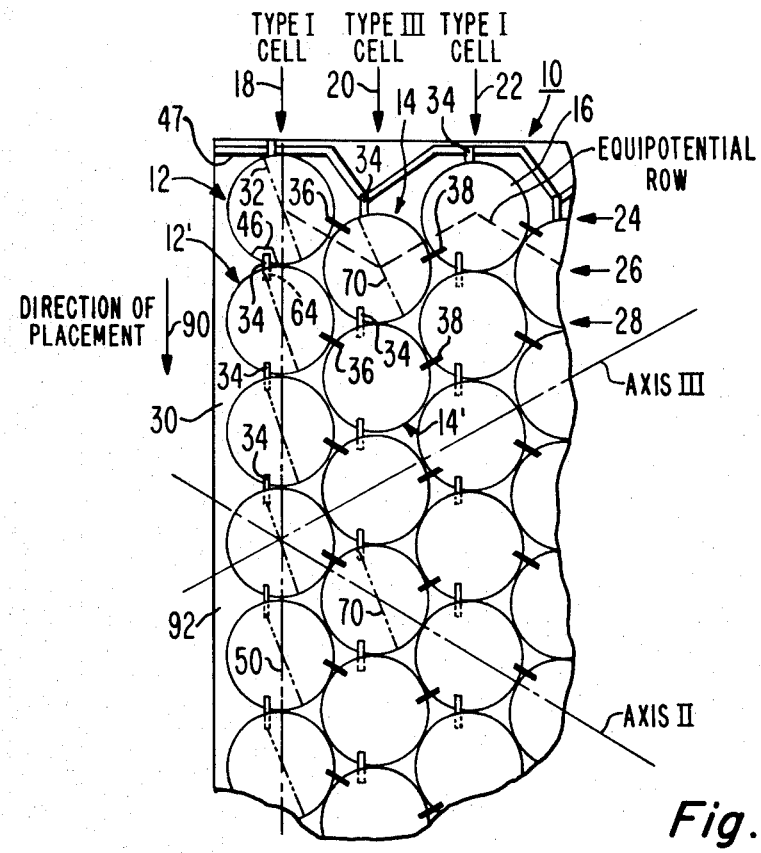

United States Patent [19]

Crouthamel et al.

[11] 4,350,836
[45] Sep. 21, 1982

[54] SOLAR ARRAY CONSTRUCTION

[75] Inventors: Marvin S. Crouthamel, Pennsauken; Peter J. Coyle, Oaklyn, both of N.J.

[73] Assignee: The United States of America as represented by the United States Department of Energy, Washington, D.C.

[21] Appl. No.: 196,273

[22] Filed: Oct. 14, 1980

[51] Int. Cl.³ .................... H01L 31/04; H01L 31/18
[52] U.S. Cl. .................................. 136/244; 29/572
[58] Field of Search .............................. 136/244, 251

[56] References Cited

U.S. PATENT DOCUMENTS

| | | | |
|---|---|---|---|
| 3,268,366 | 8/1966 | Guyot | 136/251 |
| 3,574,925 | 4/1971 | Schneider et al. | 228/180 R |
| 3,575,721 | 4/1971 | Mann | 136/244 |
| 3,833,426 | 9/1974 | Mesch | 136/244 |
| 4,045,245 | 8/1977 | Coleman et al. | 136/251 |
| 4,084,985 | 4/1978 | Evans, Jr. | 136/206 |
| 4,089,705 | 5/1978 | Rubin | 136/204 |
| 4,131,755 | 12/1978 | Keeling et al. | 136/244 |
| 4,132,570 | 1/1979 | Caruso et al. | 136/244 |
| 4,154,998 | 5/1979 | Luft et al. | 219/10.49 R |
| 4,184,903 | 1/1980 | Dillard et al. | 156/104 |

FOREIGN PATENT DOCUMENTS 2040562  8/1980  United Kingdom ................ 136/244

Primary Examiner—Aaron Weisstuch

[57] ABSTRACT

An interconnect tab on each cell of a first set of circular solar cells connects that cell in series with an adjacent cell in the set. This set of cells is arranged in alternate columns and rows of an array and a second set of similar cells is arranged in the remaining alternate columns and rows of the array. Three interconnect tabs on each solar cell of the said second set are employed to connect the cells of the second set to one another, in series and to connect the cells of the second set to those of the first set in parallel. Some tabs (making parallel connections) connect the same surface regions of adjacent cells to one another and others (making series connections) connect a surface region of one cell to the opposite surface region of an adjacent cell; however, the tabs are so positioned that the array may be easily assembled by depositing the cells in a certain sequence and in proper orientation.

10 Claims, 8 Drawing Figures

SOLAR ARRAY CONSTRUCTION

The Government has rights in this invention pursuant to Contract No. JPL PO954868 on RCA u/NAS7-100 awarded by NASA.

The invention relates to a solar cell array construction and to a method of fabricating the array.

Many different solar cell array configurations have been proposed with the objective of reducing cost (both of materials and assembly), and improving performance. The present invention is directed to a construction and process directed to this end.

In accordance with an embodiment of the present invention solar cells are provided with two types of tabs prior to assembly into an array so that the cells, when assembled into the array, preferably by automatic means, can be interconnected in series and in parallel, by connecting the tabs on one cell to tabs of adjacent cells.

Figure 2:
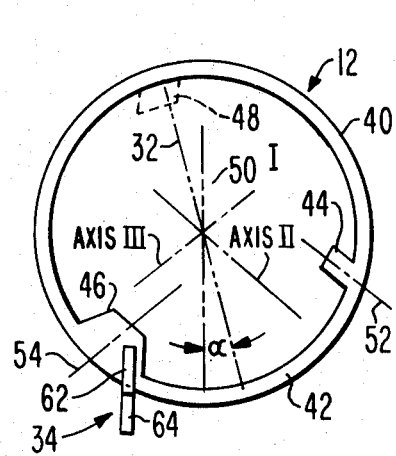
Figure 3:
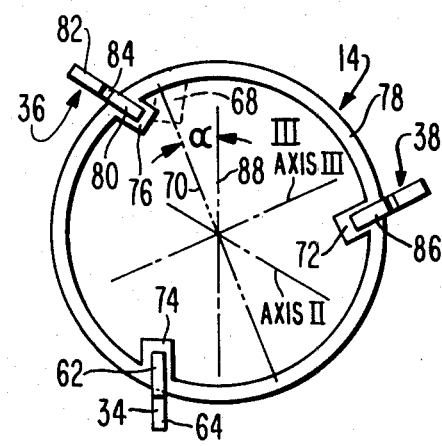
Figure 4:
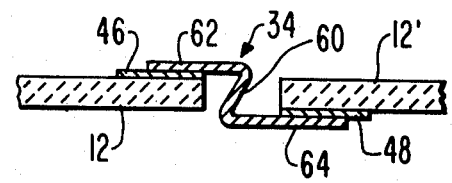
Figure 5:
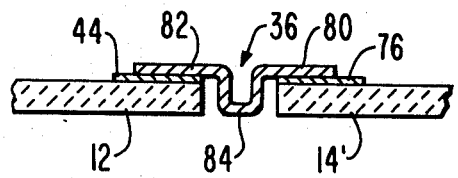
Figure 6:
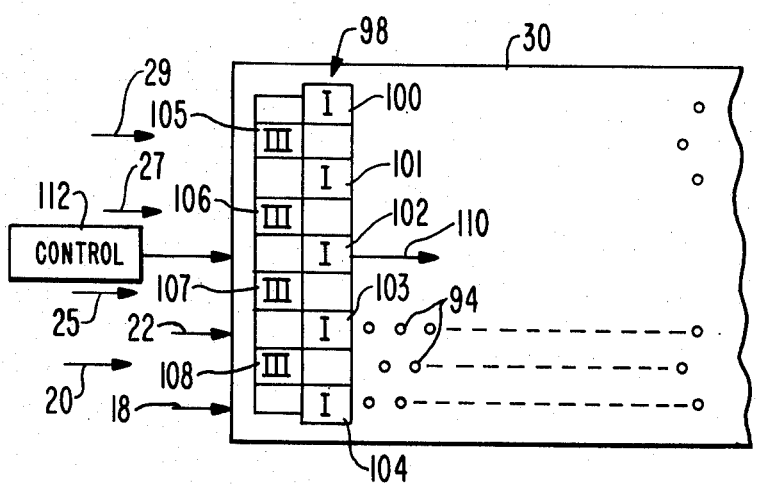
Figure 7:
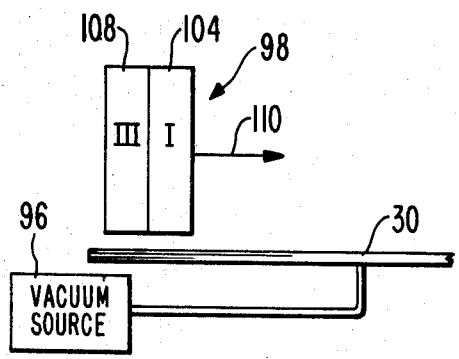
Figure 8:
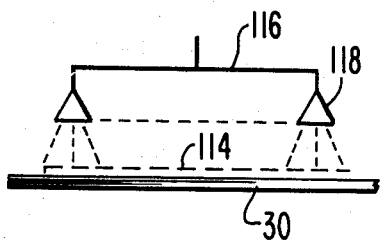

In the drawing:

FIG. 1 is a plan view of a solar array construction in accordance with an embodiment of the present invention, FIG. 2 is a plan view of one type of cell interconnection used in the array of FIG. 1, FIG. 3 is a plan view of a second type of cell interconnection used in the array of FIG. 1, FIGS. 4 and 5 are side elevation section views illustrating different interconnect tabs used for interconnecting the cells of FIG. 1, FIG. 6 is a plan view illustrating an automatic assembly apparatus for assemblying the cells of FIGS. 2 and 3 into the array of FIG. 1, FIG. 7 is a side elevation view of the apparatus of FIG. 6, and FIG. 8 is a side elevation view of an apparatus used for soldering the interconnect system of FIG. 1.

In FIG. 1, solar array 10 comprises a plurality of circular solar cells 12, 14, 16 arranged in columns several of which are shown at 18, 20, 22, and in rows such as rows 24, 26, 28. The cells are secured temporarily to a support 30 by a vacuum system during manufacture. The cells 12, 14 and 16 have identical grid elements on their radiation receiving surfaces which face into the drawing, FIG. 1. The surface of the cells facing the observer is the non-radiation receiving surface and comprises a ground electrode which may be in the form of radially extending spokes (not shown to simplify illustration) surrounded by a peripheral rim 42, FIG. 2, or 78, FIG. 3, circumscribing the cells adjacent their edges. The radiation receiving surface includes a grid current collecting structure (not shown) and a bus conductor which conducts current from the grid (not shown) to a path along an axis indicated by broken line 32, passing through the cell center. These radiation facing grid elements of all of the cells 12, 14, 16 comprising the array have the same construction and orientation.

The interconnection structure of the cells for interconnecting the cells in the array forms two groups of types of cells. The cells is alternate columns 18, 22 and so forth, are of one interconnection construction and may be labeled Type I. This structure is illustrated in more detail in FIG. 2. A second type of cell is labeled Type III and is placed in alternate columns 20, 25, 27, 29 (FIG. 6) which columns alternate with columns 18, 22 and so forth. The Type I cells (FIG. 2) have secured thereto one interconnection tab 34, prior to assembly of the cell into the array. When the cells are in place in an array, the tab 34 alignes with the pad 48 of an adjacent cell in the same column as will be discussed. The Type III cells, FIG. 3, have three interconnecting tabs 34, 36 and 38 secured thereto prior to assembly into the array. All of the cells prior to assembly in the array comprise either Type I cells with a single tab 34 or a Type III cell with three tabs 34, 36 and 38.

In FIG. 2, Type I cell 12 comprises a wafer of semiconductor material 40 having an emitter region for receiving photons facing into the drawing and a base region coupled to the emitter region facing the viewer. This is a typical construction common to all cells in the array. Peripheral bus conductor 42 is screened (as are all of the grid elements) to the facing base region surface of the wafer 40 adjacent its peripheral edge. Solder pads 44 and 46 are screened on the base surface at the same time in conductive contact with the bus 42. Solder pad 46 is spaced 120° from the solder pad 44 and is sufficiently large to receive two tab interconnects as will be described. A thid solder pad 48, shown in phantom, is screened on the opposite radiation receiving side of the wafer 40 and lies on the broken diametrical line 32 which is the center line of the bus conductor (not shown) on the opposite (emitter) surface of the wafer. This bus conductor is in electrical contact with solder pad 48. Solder pad 48 is positioned about 120° from the pads 44 and 46, relative to the center of the wafer.

Preferably, the solder pad 48 is offset from the column 18 axis 50, FIGS. 1 and 2, by orienting the broken line 32 at a small angle α with respect to the axis 50. Angle α is about 23° in one example. This offset arrangement displaces the pad 48 from the axis 50 by a small distance. Two lines may be drawn through the centers of the cells in the array to form axis II and axis III, as shown. The pad 44 extends parallel to broken line 52 which passes roughly through the center of pad 44 and is parallel to axis II. The pad 44 is offset by a small amount from the axis II. A line 54 which is parallel to and offset from the axis III can be drawn roughly through the center of pad 46. The pad 46 is offset a small amount from axis III. The reasons for the offsets of pads 44 and 46 will be explained later.

The Type I solar cell, FIG. 2, is so labeled because it has a single tab 34 pretabbed to it, prior to the assembly of the array. Tab 34 provides a series connection between adjacent cells of a column in a direction indicated at 18, FIG. 1. As seen more clearly in FIG. 4, tab 34 comprises a narrow strip of sheet metal having an approximately "Z" shape with a reverse bend portion at 60. Tab 34 has contact elements 62 and 64 extending from portion 60. Element 62 is soldered to pad 46 in a pretabbing operation prior to assembly of that cell into the array as will be explained. Contact element 64 of each tab 34 is connected to solder pad 48 of the next adjacent cell of that column when the array is formed. For example, in FIG. 4, element 64 of cell 12 is soldered to pad 48 of the next adjacent cell 12' after assembly of the pretabbed cells into the array configuration.

Reverse bend 60 provides stress relief due to thermally induced excursions between materials of different coefficients of thermal expansion, such as the interconnect tabs and the cells and various lamination layers (not shown) laminated to the cells in the final array assembly. Tab 34 is designated a series tab and is identical for all series connections in each column throughout the array. These tabs are drawn in light outline form in FIG. 1. All Type I cells such as cell 12 have a single tab 34 pre-connected to its solder pad 46 prior to formation of the array.

A second type of cell 14, Type III, FIG. 3, is so designated because it has three interconnecting tabs 34, 36 and 38 prior to its assembly into the array. Tab 34 is secured to solder pad 74 on the base region surface of cell 14 via element 62 in a manner identical to that of cell 12 as described above. Interconnect tabs 36 and 38 are connected to the respective solder pads 76 and 72 also on the base region surface. These latter tabs form parallel connections with adjacent Type I cells and form therewith an equipotential row. The pads 72, 74 and 76 are screened onto the base region or non-radiation receiving surface of the cell integral with and at the same time as the peripheral bus conductor 78. Solder pads 72, 74 and 76 are spaced approximately 120° apart. Pad 68 is located in the same general region as the solder pad 76 but on the opposite surface (the radiation receiving emitter surface) of the cell and may slightly overlap pad 76. The solder pad 68 lies on diametrical broken line 70 which is the center line of the bus conductor (not shown) of the current collecting grid on the emitter side of the wafer. The bus conductor is in electrical contact with pad 68 which is also about 120° from each of pads 72 and 74. The line 70 is at angle $\alpha$ with respect to column 20 axis 88 which is parallel to axis 50. This angle $\alpha$ offsets the pad 68 from axis 88 the same distance as the pads 48, FIG. 2, are offset from the line 50. The pad 76 is oriented along a line (not shown) approximately parallel to and offset from axis II. The pad 72 is oriented along a line (not shown) parallel to and offset from axis III.

In FIGS. 1 and 5, tab 36, which is identical in construction to tab 38, connected between cell 14', column 20, and cell 12', column 18. Cell 12' is identical in construction to the cell 12 described above. Tab 36 comprises two contact elements 80 and 82 separated by a bight 84 which serves as a stress relief for changes in diametrical dimensions of the cells in response to thermal cycling as discussed above. Contact element 80 is soldered to solder pad 76 on Type III cell 14' prior to the assembly of the array. Tab 38 has its contact element 86 soldered to solder pad 72 of cell 14' also prior to the assembly of the array. Tab 34 has its contact element 62 soldered to pad 74 as discussed above in connection with cell 12.

Tab 34 of cell 14, FIG. 3. is aligned with its length parallel to axis 88; tab 36 is aligned with its length parallel to axis II; and the tab 38 length is aligned parallel to axis III. Each tab is offset from its corresponding axis as discussed above. The tabs 34, 36 and 38 are secured to the TYPE III cells prior to the cells being assembled into the array.

When assembly in an array, the tab 34 makes contact to and is secured to pad 68 on the emitter surface of the next adjacent column cell forming a series connection. Tab 36 such as on cell 14' (FIG. 5) makes contact to and is secured to pad 44 (FIG. 5) on the base surface of the next adjacent Type I cell such as on cell 12. Tab 38 contacts and is secured to pad 46 on the base surface of the next adjacent Type I cell. This interconnection system forms an equipotential zig-zag row (dashed line), FIG. 1, whose cells are interconnected by tabs 36 and 38 in parallel with respect to the tabs 34 series column connections.

The offset positioning of tabs 34, 36 and 38 with respect to a diametric line through the center of the wafer of each of the cells, positions the interconnect tabs offset from the closest points of tangency of each adjacent cell. The cells are not touching at these closest points of tangency but are closely spaced to one another. Offsetting the interconnect tabs from the diametrical lines as explained above ensures adequate spacing between the cells at the location of the interconnect tabs for the stress relief bight 84 (FIG. 5) of tabs 36 and 38 and the "Z" shaped stress relief bend portion 60 of tabs 34 (FIG. 4). This ensures no short circuit occurs between adjacent radiation receiving surfaces or the non-radiation receiving surfaces of the different cells which might otherwise occur if the tabs were located along the lines 50, 88 and axes II and III passing through the cell centers.

The entire array, FIG. 1, comprises cells both of FIG. 2 and FIG. 3 with alternate columns being Type I cells (FIG. 2) and the remaining alternate columns Type III cells. Preferably, the solder pads 48, 44, 46, 68, 72, 74 and 76 include a sufficient amount of solder which when reflowed (melted) at an elevated temperature connect a corresponding contact element of the various tabs thereto. This reflow operation will be explained later in connection with FIG. 8.

By pre-tabbing the cell wafers as configured in FIGS. 2 and 3, these wafers are now suitable for automatic assembly into the array of FIG. 1. Such automatic assembly requires the pre-orientation of the cells as shown in FIG. 1. The Type I cells, FIG. 2, are first assembled in columns 18, 22 and so forth, FIG. 1, in the direction of arrow 90, that is, with the topmost cell in a column being put in place first, followed by the next cell and so on. Each cell is oriented so that the pad 48 of each type I cells, FIG. 2, placed in position in the array overlays the contact element 64 of tab 34 of the cell immediately above it in the same column (FIG. 1). Upon completion of the placement of the Type I cells in all columns, the Type III cells may be placed in position.

In the alternative, the rows of cells may be assembled sequentially. In FIG. 1, the Type I cells of row 24 may be placed in position first. Then the Type III cells row 26 may be placed in position, followed by the Type I cells row 28, and so on.

Each Type III cell is nested between four adjacent Type I cells as shown so that its center is positioned along a line midway between a line through the centers of the Type I cells in the direction of rows 24, 26 and 28. Again the cells are placed in position sequentially, with the top most cell in the column first, followed by the next adjacent cell, and so on. The pads 68 of each Type III cell placed in position overlies the tabs 34 of the previously placed cells in that column assuming, as in the case, the proper orientation of each cell when put in place. Further, the tabs 36 and 38 also overlie the solder pads 44 and 46, respectively, of adjacent Type I cells in the adjacent columns 18, 22. Placement of the cells as described, that is, sequentially in the direction of the arrow 90, FIG. 1, after starting at the top, ensures that the tabs 34 overlie corresponding solder pads assuming proper orientation of each cell. Tabs 36 and 38 overlie the next adjacent Type I cells at their respective solder pads at the same time. Thus, pre-placing the tabs on and preorienting the Type I and Type III cells readily lends the arrangement to automatic assembly into an array, FIG. 1.

In FIG. 1, a zig-zag bus bar conductor 47 is pretabbed with tabs 34 at their contact elements 62 (FIG. 4). A tab 34 is positioned on the bus conductor 47 to receive an overlying pad 48 or 68 of the initial rows 24 and 26 (FIG. 1) of cells. The conductor 47 is connected to a connector (not shown) after the array is formed and assembled into a laminated structure (not shown). A second bus bar conductor (not shown) is at the other end of the array to complete the circuit.

The array can be formed by apparatus illustrated in FIGS. 6, 7 and 8. In FIG. 6 support 30 has a plurality of vacuum ports 94. Each vacuum port 94 is for a separate cell. Vacuum source 96, FIG. 7, provides the vacuum in a manifold (not shown) in support 30, which manifold communicates with the ports 94. The ports 94 are positioned at the centers of the cells forming the array.

A cell magazine assembly 98 is spaced above support 30 and dispenses Type I and Type III cells. The Type I cells are placed in magazines 100-104 aligned with one another in the orientation shown in FIG. 1. Each of the magazines 100-104 corresponds to a separate column, 18, 22, and so forth, FIG. 6. Attached to a side of the magazines 100-104 are the Type III cell magazines 105-108. These magazines are illustrated schematically in FIGS. 6 and 7. It is to be understood that they include suitable apparatus for holding and dispensing the Type I and Type III cells in the proper orientation, that is, with the tabs and pads oriented as shown in FIGS. 1, 2 and 3. The magazines are attached to a guide and bearing system (not shown) which traverse the magazines in direction 110. A control 112, FIG. 6, operates the magazines, driving them in the direction 110 and dispensing the Type I or Type III cells in the desired sequence. Control 112 may be an electronic or mechanical pneumatic system response to a switch. The control 112 moves the magazines in the direction 110 when desired and also starts the magazines of the Type I and Type III cells dispensing their respective cells when the magazines are over the assigned vacuum ports 94. For example, suitable sensors such as microswitches or electrical contacts (not shown) may be placed along the support 30 for providing an electrical indication of the correct position of the magazines along the support 30. Upon receiving the signal indicating such a position, the control 112 operates a suitable release and dispensing mechanism in the magazines 98 for dispensing the appropriate Type I or III cells at that time.

The Type I cells are placed in magazines forward of the Type II cells with respect to direction 110 so that as the magazine assembly 98 traverses in direction 110, the Type III cells and the Type I cells can be automatically dispensed at the same time after the initial rows of Type I cells is dispensed. For example, after cells 12, 16 and so on FIG. 1, row 24, are dispensed by magazines 104, 103 ... 100, the magazines are moved to the following rows. The set 104-100 are moved to row 26 and the magazines 105-108 are then in position to dispense the cells in row 26. Thus, the cells in these two rows may be placed in position next, with the cells in the upper row (26 in this case) of a pair of adjacent rows always being dispensed before the cells in the lower row of the pair (28 in this case) to insure proper overlays of the tabs. As already mentioned, as the cells are loaded into the magazines in the proper orientation (alignment devices such as ridges or the like within the magazines can be employed to assure such alignment) the pads and tabs are in the correct orientation when the cells are deposited onto the support 30 where they are held in place by vacuum.

In FIG. 8, a solder reflow system is illustrated in which the array of cells (dashed at 114) on the support 30 is positioned beneath source of radiation 116 which may be a number of heat lamps 118, as known in this art. The heat lamps 118 radiate sufficient energy to raise the temperature of the solder pads on each of the cells on both sides thereof sufficiently to melt the solder and reflow the solder connecting each of the tabs thereto that are overlaid therewith. The radiation heats the cells sufficiently so that the underside solar pads melt due to conduction. An insulator such as a rubber sheet may be placed directly underneath the cell array to concentrate the heat onto the cells. Source of radiation 116 comprising the heat lamps 118 may be on a movable carriage which is placed into position over the solar arrays after the magazines 98 dispense the solar cells onto the support 30. During the dispensing of the cells and operation of the heat lamp, the vacuum source 96, FIG. 7, continually applies a vacuum to the support 30 holding all of the cells in place. Upon completion of the soldering operation, FIG. 8, the vacuum is then removed and the now soldered array can be removed for assembling of the array to its final configuration.

The tabs 34, 36 and 38 may comprise relatively thin sheet metal foils which are pre-formed and assembled to the cells in a separate operation. Assembly of the tabs may be by any conventional technique. The tabs should be oriented parallel to the lines 50, 70 and 88 of FIGS. 1 and 3 so that the tabs are properly oriented for mating with the solder pads of the varius cells at the appropriate time.

The particular solar array illustrated in FIG. 1 includes only solar cells connector elements and a support 30 on which the solar array is constructed. The support 30 does not form any part of the array structure. The array, however, may embody other elements in the complete form, such as glass plates and reinforcing elements for the perimeter of such glass plates, connectors for connecting the array output, and such other elements as required for a complete solar array laminate construction.

What is claimed is:

1. A solar array construction comprising:
a first plurality of spaced columns of solar cell circular wafers having first and second surfaces of opposite conductivity, the centers of the cells being aligned in the columns in first parallel axes and in rows in second parallel axes;
a second plurality of spaced columns of solar cell circular wafers having first and second surfaces of opposite conductivity, the centers of the cells being aligned in columns in axes parallel to said first axes and in rows parallel to said second axes, the row axes of said second plurality of spaced wafers being spaced about midway between said second axes; and
interconnect means for connecting the wafers in each column in series, and the wafers in each row, comprising one wafer in each column, in parallel, the radiation receiving surface of said cell wafers facing in the same direction, said interconnected means comprising a plurality of separate, discrete interconnected tabs arranged in three groups aligned parallel to three corresponding intersecting axes.

2. The construction of claim 1 wherein said second plurality of columns alternate with said first plurality, said tabs comprise a first set for interconnecting the wafers of said columns in said series connection, and second and third sets of connector tabs for interconnecting the wafers in said parallel connection, the tabs of the second set each being connected to a corresponding wafer in the first plurality of columns on a wafer side opposite said radiation receiving surface, each column of the first plurality being an even numbered column, said second set tabs also being connected to a next adjacent wafer in a column of the second plurality of columns, each column of said second plurality of columns being an odd numbered column, said third set of connector tabs each being connected on said opposite side to said corresponding wafer in said even numbered column and to a wafer in a next adjacent odd numbered column different than the column to which said second set is connected, said second set lying on a first line parallel to the centers of said wafers in one direction, said third set lying on a second line parallel to the centers of said wafers in a second direction intersecting said one direction.

3. The array construction of claim 1 wherein said tabs comprise a first set of approximately "Z" shaped tabs for connecting said columns in series, and a second set of tabs including a "U" shaped bend for connecting said rows in parallel.

4. The array construction of claim 3 wherein said first set of tabs lie on a line parallel to a first line through the centers of said wafers in the corresponding column and the second set of tabs comprise two groups, one group lying on a line parallel to a second line through the centers of some of said wafers intersecting said first line and a second group lying on a line parallel to a third line through the centers of other of said wafers intersecting said first and second lines.

5. The array construction of claim 4 wherein each said first, second and third lines are offset from the corresponding parallel lines through said centers.

6. The array construction of claim 5 wherein each wafer in a plurality of said first plurality of columns has a set of at least three tab connecting pads, two of said three pads being on one side of said wafer and the third of said pads being on the opposite side of said wafer, the third pad on the opposite side being connected to one tab of said first set of tabs, a first of said two pads being connected to a different tab of said first set of tabs and to a tab of one of said groups, the second of said two pads being connected to a tab of the remaining group.

7. A solar cell array in which the cells comprise circular disks of semi-conductor material of one conductivity type on a first surface and a second conductivity type on the opposite second surface in which all said one surfaces face in the same direction comprising:

a first plurality of spaced columns of said cells the cells of which are arranged in a first set of parallel rows;

a second plurality of spaced columns of said cells the cells of which are arranged in a second set of parallel rows offset from the first set of rows so that each cell of the second set, except for those in an end row, is tangent to two cells in a next adjacent column of the first set;

a plurality of first interconnect tabs connected between the first surface of one cell and the second surface of a second cell in a given column to form a series connection between adjacent cells in that column, said first tabs being aligned along a first line parallel to that column;

a plurality of second interconnect tabs connected to the second surfaces of cells in adjacent first and second columns; and a plurality of third interconnect tabs connected to the second surfaces of cells in adjacent second and third columns;

said second tabs being oriented along a line parallel to and spaced from a second line passing through the centers of said cells in a first direction;

said third tabs being oriented along a line parallel to and spaced from a third line passing through the centers of said cells in a second direction different than said first direction;

said second and third tabs connecting the cells in said columns in parallel.

8. The array of claim 7 wherein each line is at an angle of roughly 120° with respect to the line adjacent thereto.

9. The array of claim 7 wherein said second and third tabs interconnect said second surfaces adjacent the points of tangency of their corresponding cells.

10. The array of claim 7 wherein each cell of the second plurality of columns has three electrical connector terminal pads for said tabs on said second surface, one of said pads being connected to a first tab, a second pad being connected to a second tab, and thwe third pad being connected to a third tab.

* * * * *